United States Patent
Ghyselen et al.

(10) Patent No.: US 7,375,008 B2
(45) Date of Patent: *May 20, 2008

(54) RECYCLING BY MECHANICAL MEANS OF A WAFER COMPRISING A MULTILAYER STRUCTURE AFTER TAKING-OFF A THIN LAYER THEREOF

(75) Inventors: Bruno Ghyselen, Seyssinet-Pariset (FR); Cécile Aulnette, Grenoble (FR); Bénédite Osternaud, Saint Laurent du Pont (FR); Takeshi Akatsu, Saint Nazaire les Eymes (FR); Bruce Faure, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 342 days.

This patent is subject to a terminal disclaimer.

(21) Appl. No.: 11/075,272

(22) Filed: Mar. 7, 2005

(65) Prior Publication Data

US 2005/0189323 A1 Sep. 1, 2005

Related U.S. Application Data

(63) Continuation of application No. PCT/IB2004/000285, filed on Jan. 7, 2004.

(60) Provisional application No. 60/472,470, filed on May 22, 2003.

(30) Foreign Application Priority Data

Jan. 7, 2003 (FR) .................................. 03 00098

(51) Int. Cl.
*H01L 21/30* (2006.01)
*H01L 21/46* (2006.01)

(52) U.S. Cl. ................ 438/459; 438/458; 257/E21.568
(58) Field of Classification Search ................ 438/475, 438/481, 458, 459; 257/E21.568
See application file for complete search history.

(56) References Cited

U.S. PATENT DOCUMENTS 6,010,579 A 1/2000 Henley et al.

(Continued)

FOREIGN PATENT DOCUMENTS

FR 2 775 121 8/1999
WO WO 99/41776 8/1999

OTHER PUBLICATIONS

B. Holländer et al., "Strain relaxation of pseudomorphic $Si_{1-x}Ge_x$/Si(100) heterostructures after hydrogen of helium ion implantation for virtual substrate fabrication", Nuclear Instruments and Methods in Physics Research B 175-177 (2001) 357-367 (2001).

(Continued)

*Primary Examiner*—Scott B. Geyer
*Assistant Examiner*—Seahvosh J Nikmanesh
(74) *Attorney, Agent, or Firm*—Winston & Strawn LLP

(57) ABSTRACT

The invention relates to a method of re-forming a useful layer on a donor wafer after taking off a useful layer formed of a material chosen from among semiconductor materials. The donor wafer includes in succession a substrate and a taking-off structure, the taking-off structure includes the taken-off useful layer before taking-off. The method includes a removal of material involving a portion of the donor wafer on the side where the useful layer has been taken off. The material is removed by mechanical means so as to preserve a portion of the taking-off structure to form at least one other useful layer which can be taken off after re-forming, without adding additional material to the wafer.

27 Claims, 1 Drawing Sheet

U.S. PATENT DOCUMENTS

| | | | |
|---|---|---|---|
| 6,284,628 B1 | 9/2001 | Kuwahara et al. | |
| 6,426,270 B1 | 7/2002 | Sakaguchi et al. | |
| 6,500,732 B1 | 12/2002 | Henley et al. | |
| 6,537,370 B1 | 3/2003 | Hernandez et al. | |
| 6,573,126 B2* | 6/2003 | Cheng et al. | 438/149 |
| 6,596,610 B1 | 7/2003 | Kuwabara et al. | |
| 6,936,523 B2* | 8/2005 | Berne et al. | 438/458 |
| 7,052,979 B2* | 5/2006 | Nagai et al. | 438/478 |
| 7,256,075 B2* | 8/2007 | Ghyselen et al. | 438/149 |
| 7,268,060 B2* | 9/2007 | Ghyselen et al. | 438/458 |
| 7,297,611 B2* | 11/2007 | Maleville | 438/458 |
| 2004/0029365 A1* | 2/2004 | Linthicum et al. | 438/481 |
| 2004/0053477 A1 | 3/2004 | Ghyselen et al. | |

OTHER PUBLICATIONS

R.T. Leonard et al., "*Photoassisted dry etching of GaN*", Applied Physics. Lett., vol. 68, No. 6, pp. 794-796, (1996).

S.J. Pearton et al, "*Low bias electron cyclotron resonance plasma etching of GaN, AlN, and InN*", Applied Physics. Lett., vol. 64, No. 7, pp. 2294-2296, (1994).

L.J. Huang et al, "*SiGe-on-insulator prepared by wafer bonding and layer transfer for high-performance field-effect transistors*", Applied Physics. Lett., vol. 78, No. 9, pp. 1267-1269, (2001).

S. Nakamura, "*InGaN/GaN/AlGaN-Based Laser Diodes with an Estimate lifetime of longer than 10,000 hours*", Mrs Bulletin, vol. 23, No. 5, pp. 37-43 (1998).

Q.Y. Tong et al., Extracts of "*Semi-conductor on wafer bonding*", Science and Technology, Interscience Technology, a Wiley Interscience Publication, Johnson Wiley & Sons, Inc.

* cited by examiner

RECYCLING BY MECHANICAL MEANS OF A WAFER COMPRISING A MULTILAYER STRUCTURE AFTER TAKING-OFF A THIN LAYER THEREOF

CROSS-REFERENCE TO RELATED APPLICATIONS

This application is a continuation of International Application PCT/IB2004/000285 filed Jan. 7, 2004, and claims the benefit of provisional application 60/472,470 filed May 22, 2003, the entire content of each of which is expressly incorporated herein by reference thereto.

FIELD OF INVENTION

The present invention relates to the recycling of a donor wafer after taking off a useful layer of semiconductor material. This recycling includes the removal of material involving a portion of the donor wafer on the surface where the useful layer was taken off.

BACKGROUND OF THE INVENTION

Before taking off the useful layer, the donor wafer comprises a substrate and a useful layer that is to be taken off or transferred from the substrate. The useful layer is typically obtained by epitaxially depositing the layer on the substrate.

After removal, the useful layer is integrated with a structure in which components will be formed, particularly in the fields of microelectronics, optics, or optoelectronics, for the most part.

The layer to be taken off must therefore attain a high level of quality determined according to one or more specific criteria. The quality of the layer to be taken off largely depends on the growth support, that is, on the quality of the substrate on which it is epitaxially deposited.

The formation of such a high quality substrate is often complex and requires particular attention, involving technical difficulty and a raised economic cost. This latter point is further confirmed when considering the removal of a layer of a composite semiconductor material such as an alloy. In this situation, the epitaxy substrate also must exhibit a structure which is often difficult and costly to implement. Thus, substrates can be provided with a buffer layer to specifically avoid such difficulties of implementation.

The term "buffer layer" is generally understood to mean a transition layer between a first crystalline structure such as a support substrate and a second crystalline structure having as a first function a modification of the properties of the material, such as structural, stoichiometric properties or a surface atomic recombination. Buffer layers permit the support structure to include a second crystalline structure having a lattice parameter that differs substantially from that of the support substrate.

A first technique of forming a buffer layer consists in effecting the growth of successive layers so as to form a structure having a composition varying gradually in thickness, the gradual variation of components of the buffer layer then being directly associated with a gradual variation of its lattice parameter.

A layer, or superposed layers, formed on the buffer layer can be taken off from the donor wafer, and transferred to a receiving substrate so as to form a well-defined structure.

One of the main applications of a transfer of thin layers formed on a buffer layer concerns the formation of layers of elastically stressed silicon, and especially, in the case where the silicon is stressed in tension, because certain of its properties, such as electron mobility in the material, are then distinctly improved.

Other materials, such as for example SiGe, can also be the subject of a substantially analogous taking-off or transferring procedures.

A transfer of such layers onto a receiving substrate, specifically by a method termed SMART-CUT® that is known skilled artisans, then permits structures to be formed such as SeOI (Semiconductor On Insulator) structures.

For example, after taking-off an elastically relaxed layer of SiGe, the structure obtained, including the taken-off layer, can then serve as a growth support for silicon which will be placed under tension by the layer of relaxed SiGe.

As an illustration, an example of such a method is described in the IBM document of L. J. Huang et al., ("SiGe-On-Insulator prepared by wafer bonding and layer transfer for high-performance field-effect transistors", Applied Physics Letters, 26, Feb. 2001, Vol. 78, No. 9) in which a process is given for forming an Si/SGOI structure.

Other applications of growth on a buffer layer are possible, particularly with Group III-V semiconductors. Transistors are thus commonly formed in technologies based on GaAs or based on InP. In terms of electronic performance, InP has an appreciable advantage over GaAs. For the main reasons of cost and feasibility, the chosen technique consists of transferring to a receiving substrate a taken-off layer of InP obtained by growth on a buffer layer on a support substrate of GaAs.

Certain taking-off methods, such as a method of the "etch-back" type, then entail a destruction of the remaining portion of the support substrate and of the buffer layer during taking-off. In certain other methods of taking-off, the support substrate is recycled but the buffer layer is lost.

The technique of formation of a buffer layer is complex. Moreover, to minimize its density of crystallographic defects, the thickness of a buffer layer is generally considerable, typically between one and several micrometers. The production of such a buffer layer thus leads to an often long, difficult and costly implementation.

A second technique of production of a buffer layer is disclosed in particular in WO 00/15885, which has as its main object to elastically relax a layer of Ge that is stressed by means of a Ge buffer layer.

This technique is based on specific epitaxy conditions, specifically associating the parameters of temperature, time, and chemical composition.

With respect to the first technique, it has the main advantage of being simpler, shorter, and less costly to perform.

The buffer layer finally obtained is moreover not as thick as a buffer layer formed according to the first technique.

A third technique of formation of a buffer layer is disclosed by B. Höllander et al., particularly in the document entitled "Strain relaxation of pseudomorphic $Si_{1-x}Ge_x/Si$ (100) heterostructures after hydrogen or helium ion implantation for virtual substrate fabrication" (in Nuclear and Instruments and Methods in Physics Research B 175-177 (2001) 357-367).

It consists of relaxing elastic stresses present in the layer to be taken off by means of a deep hydrogen or helium implantation.

Thus from this point of view, this third technique can give a result close to a buffer layer produced according to one of the two previous techniques with substantially less demands of implementation.

The method describes specifically a relaxation of a SiGe layer stressed in compression, this layer being formed on an Si substrate.

The technique used comprises implantation of hydrogen or helium ions through the surface of the stressed layer in the Si substrate to a given depth, generating perturbations in the thickness of Si above the implanted zone (this thickness then forms a buffer layer) and causing, under heat treatment, a certain relaxation of the SiGe layer.

This technique seems to be shorter, easier to practice, and less costly than the first technique of forming a buffer layer.

An advantage of using this technique would be to later integrate this relaxed or pseudo-relaxed layer into a structure for the fabrication of components, particularly for electronics or opto-electronics.

However, in a manner similar to the first technique for forming a buffer layer, a buffer layer made according to one of the last two techniques is removed during the known techniques of recycling of the donor wafer after taking-off. Technical difficulties of implementation remain in carrying it out, so that improvement of the process is needed.

SUMMARY OF THE INVENTION

The present invention aims to improve the situation, proposing according to a first aspect a method of recycling a donor wafer after taking off a useful layer comprising a material chosen from among semiconductor materials, the donor wafer comprising in succession a substrate and a taking-off structure, the taking-off structure before taking-off comprising the taken-off useful layer, the method comprising a removal of material involving a portion of the donor wafer on the side where the taking-off has occurred, wherein the removal of material comprises an implementation of mechanical means of attack so as to preserve a portion of the taking-off structure comprising at least one other useful layer which can be taken off after recycling, without a supplementary step of reforming the useful layer.

According to a second aspect, the invention proposes a method of forming a donor wafer intended to provide a useful layer by taking-off and capable of being recycled after taking-off by the recycling process, wherein it comprises the formation of a taking-off structure on a substrate.

According to a third aspect, the invention proposes a method of taking off a useful layer from a donor wafer to be transferred to a receiving substrate, which comprises:

(a) bonding the donor wafer to the receiving substrate on the side of the useful layer to be taken off;

(b) detaching of the useful layer which includes the taking-off structure (I) of the donor wafer; and (c) recycling the donor wafer according to the said recycling process.

According to a fourth aspect, the invention proposes a cyclic method of taking off useful layers from a donor wafer, wherein it comprises a succession of steps of taking off a useful layer, each of these steps being in accordance with the taking-off method.

According to a fifth aspect, the invention proposes an application of the cyclic taking-off method or of the taking-off method to the formation of a structure comprising the receiving substrate and the useful layer, the useful layer comprising at least one of the following materials: SiGe, Si, an alloy belonging to Groups III-V, the composition of which is respectively chosen from among the possible combinations: (Al, Ga, In)—(N, P, As).

According to a sixth aspect, the invention proposes a donor wafer having provided a useful layer by taking-off, and recycled or capable of being recycled by the recycling process, wherein it comprises in succession a substrate, and a taking-off structure having provided the useful layer and having, after taking-off, a sufficient thickness to comprise at least one other useful layer to be provided.

BRIEF DESCRIPTION OF THE DRAWING

Other aspects, objects and advantages of the present invention will become apparent upon a review of the following detailed description and examples which is made with reference to the accompanying drawing figure, in which.

DETAILED DESCRIPTION OF THE INVENTION

The present invention relates to recycling a wafer comprising a taking-off structure, after at least one useful layer (that is, a portion of the useful layer being taken off) has been taken off in order to integrate the latter into a semiconductor structure, the recycling being implemented such that the remaining portion of the taking-off structure can again provide a useful layer in a later taking-off after recycling, without the use of a step of reforming a useful layer, such as a step of crystalline growth by epitaxy.

Recycling should specifically comprise a suitable treatment which does not cause deterioration of a portion of the taking-off structure in which the useful layer is included, so that after recycling it remains possible to take off the useful layer.

In a specific configuration, there could be several useful layers which can be taken off, and it could thus be possible to have a succession of several successive takings-off, between which a recycling method according to the present invention will advantageously be used.

Figure 1A:
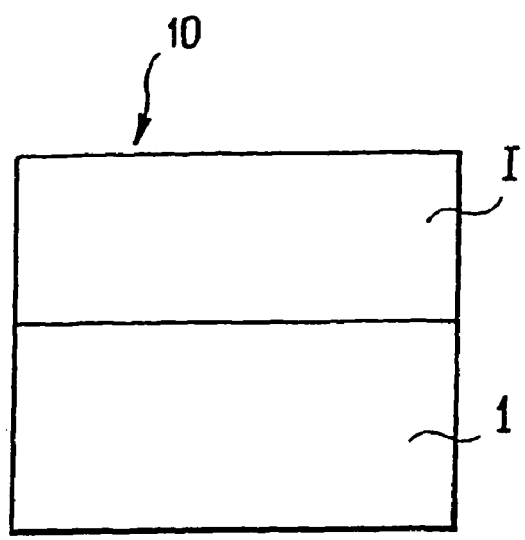
FIG. 1 shows the different steps of a method according to the invention, comprising in succession the build-up and taking-off of a thin layer from a donor wafer, followed by the polishing of the thin layer that remains on the donor wafer prior to recycling of the donor wafer and thin layer for future use.
Figure 1B:
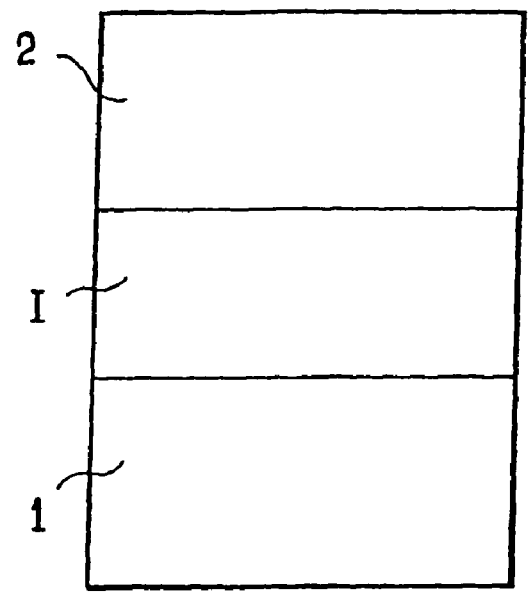

Referring to FIGS. 1a and 1b, the donor wafer 10 includes a substrate and a taking-off structure I. In a first configuration of the substrate 1, the latter includes a single crystalline material having the first lattice parameter. In a second configuration of the substrate 1, the latter is a "pseudo-substrate" includes a support substrate and a buffer structure interfaced with the taking-off structure I. Any structure behaving as a buffer layer is termed a "buffer structure". The buffer structure advantageously has at the surface a crystallographic structure which is substantially relaxed and/or is without an appreciable number of structural defects.

Advantageously, the buffer layer has at least one of the two following functions:

1) reduction of the density of defects in the upper layer; and 2) adaptation of a lattice parameter between two crystallographic structures having different lattice parameters.

To perform the second function, the buffer layer has, in the neighborhood of one of its faces, a first lattice parameter substantially identical to that of the support substrate and in the neighborhood of its other face a second lattice parameter substantially identical to that of the layer of the taking-off structure I directly overlying the buffer structure.

In a first configuration of the buffer layer, the latter is constituted by a single buffer layer.

The buffer layer, situated on the support substrate, permits the presentation at its surface of a lattice parameter substantially different from the lattice parameter of the support substrate, and thus permits having on the same donor wafer 10, a layer having a lattice parameter different from that of the support substrate.

In certain applications, the buffer layer can furthermore permit the overlying layer to avoid containing a high density of defects and/or undergoing substantial stresses.

The buffer layer can furthermore permit the overlying layer, in certain applications, to have a good surface state.

According to a first technique of forming a buffer structure, a buffer layer is formed so as to have a lattice parameter undergoing an overall progressive modification over a substantial thickness for bringing about the transition between the two lattice parameters. Such a layer is generally termed a "metamorphic layer."

This modification of the lattice parameter can be effected in a continuous manner in the thickness of the buffer layer. Or it can be effected by "steps", each step being a thin layer with a substantially constant lattice parameter, different from that of the underlying step, so as to modify the lattice parameter in a discrete fashion step by step. The lattice parameter can also have a more complex form such as a variation of composition at a variable rate, a reversal of sign of the rate, or discontinuous jumps of composition.

The progression of the lattice parameter in the buffer layer is advantageously found by substantially progressively augmenting the concentration there, starting from the support substrate, of at least one atomic element which is not included in the support substrate.

Thus, for example, a buffer layer formed on a support substrate of unitary material could be of a material which is binary, tertiary, quaternary or more.

The buffer layer is advantageously formed by growth on the support substrate, for example, by epitaxy using the known techniques such as CVD and MBE (respectively "Chemical Vapor Deposition" and "Molecular Beam Epitaxy").

Generally, the buffer layer can be formed by any other known method, in order to obtain, for example, a buffer layer constituted by an alloy of different atomic elements.

A light step of surface finishing the support substrate underlying the buffer layer, for example by CMP polishing, can, if necessary, precede the forming of the buffer layer.

In another configuration, the buffer layer formed by the first technique forms a buffer structure which includes a buffer layer (substantially identical to that of the first configuration) and an additional layer. The additional layer can be between the support substrate and the buffer layer, or on the buffer layer.

In a first specific case, this additional layer can constitute a second buffer layer, such as a buffer layer permitting defects to be confined, thus improving the crystalline quality of the taking-off structure I formed on the buffer structure.

This additional layer is of semiconductor material, preferably having a constant material composition. The chosen composition and thickness of such an additional layer to be formed are then particularly important criteria for attaining this property. Thus, for example, the structural defects in an epitaxial layer usually decrease gradually in the thickness of this layer.

In a second specific case, the additional layer is situated on the buffer layer and has a constant composition of relaxed material.

It can thus fix the second lattice parameter.

The additional layer can also have several functions, such as functions chosen from among these two last specific cases.

In an advantageous configuration, the additional layer is situated on the buffer layer and has a lattice parameter substantially different from the lattice parameter of the support substrate.

In a specific case of this advantageous configuration, the additional layer is of material relaxed by the buffer layer. The additional layer is advantageously formed by growth on the buffer layer, for example by epitaxy by CVD or MBE.

In a first embodiment, the growth of the additional layer is performed in situ, directly following the formation of the underlying buffer layer, the latter also being advantageously formed by layer growth in this case.

In a second embodiment, the growth of the additional layer is effected after a step of light surface finishing of the underlying buffer layer, for example by CMP polishing, thermal treatment, or other smoothing technique.

A second technique of forming a buffer structure is based on a technique of depositing a layer superficially onto a support substrate, this superficial layer having a nominal lattice parameter substantially different from the lattice parameter of the neighboring material of the support substrate surface. This deposition of the superficial layer is performed in such a manner that the deposited layer is practically free from plastic defects such as dislocations.

This superficial layer is formed so as to have when finished:
  a first portion in contact with the support substrate, which confines plastic defects such as dislocations, and
  a second portion, relaxed or pseudo-relaxed by the first portion, and having no or few plastic defects.

The first portion of the deposited superficial layer then plays the part of a buffer layer, because:
  it confines the plastic defects in order to preserve the second portion of the superficial layer; and
  it adapts the lattice parameter of the superficial layer to that of the substrate.

By "confinement" is meant that the great majority of the plastic defects are found in the first portion. The second portion of the superficial layer is not absolutely free from defects, but their concentration is compatible with microelectronic applications.

The deposition technique used for forming such a buffer layer advantageously includes variations in the temperature and chemical composition times of the deposition. It is thus possible to succeed in forming a buffer layer having a chemical composition substantially constant over the thickness, contrary to a buffer layer formed according to the first technique.

One or more layers can, however, be intercalated between the buffer layer and the second portion of the superficial layer.

The buffer layer may furthermore have a thickness less than the smallest thicknesses of buffer layers formed by the first technique.

WO 00/15885 teaches an example of formation of such a buffer layer according to this last technique, performing a deposition of SiGe or of Ge on a monocrystalline Si support substrate.

Such a method of deposition can also be effected, for example, according to a mode in which a deposition of monocrystalline Ge is performed on a monocrystalline Si support substrate, by using the following steps:

- stabilization in temperature of a monocrystalline silicon support substrate at a first predetermined stabilized temperature of 400° C. to 500° C., preferably 430° C. to 460° C.;
- chemical vapor phase deposition (CVD) of Ge at the first determined temperature until obtaining a base layer of Ge on the support substrate, of a predetermined thickness less than a desired final thickness;
- increase of the Ge chemical vapor phase deposition temperature from the predetermined first temperature up to a predetermined second temperature ranging from 750° C. to 850° C., preferably 800° C. to 850° C.; and
- proceeding with Ge chemical vapor phase deposition at the predetermined second temperature until the desired final thickness is obtained for the superficial layer of monocrystalline Ge.

The buffer layer is the portion of the deposited layer which is interfaced with the support substrate and which extends over a thickness for which the rate of crystallographic defects is greater than a limit value.

The thickness of this buffer layer can specifically be of the order of 0.5 to 1 micron, which is less than the thickness of a buffer layer formed according to the first technique. The other portion of the layer is at least a portion of the taking-off structure I.

Such a method of deposition can equally be effected according to alternatives—for example, those disclosed by WO 00/15885.

In this manner the substrate 1 of the donor wafer 10 has been formed, the substrate 1 comprising the support substrate and the buffer layer.

A third technique of forming a buffer structure is used on a structure comprising the substrate 1 and a layer which has been deposited on the substrate 1. The material chosen to form this layer is a material having a nominal lattice parameter which is substantially different from the lattice parameter of the surface of the substrate 1, so as to have to be elastically stressed in compression or in tension by the substrate 1.

The stressed layer has a general structure of stressed material, but can also contain one or more thicknesses of relaxed or pseudo-relaxed material which have a cumulated thickness very much less than that of the stressed layer, so that the latter retains an overall stressed state.

In all cases, the stressed layer is advantageously formed on the substrate 1 by crystalline growth, such as epitaxy using known techniques, for example, CVD and MBE.

To obtain such a stressed layer without too many crystallographic defects, such as for example point defects or extended defects such as dislocations, it is advantageous to choose the crystalline material forming the substrate 1 and the stressed layer (in the neighborhood of its interface with the substrate 1) so that they exhibit a sufficiently low difference between their respective first and second nominal lattice parameters.

For example, this difference in lattice parameter is typically about 0.5% to about 1.5%, but may also be larger. For example, in IV-V materials, Ge has a nominal lattice parameter about 4.2% greater than that of Si, and thus SiGe, with 30% Ge, has a nominal lattice parameter about 1.15% greater than that of Si.

On the other hand, it is preferable for the stressed layer to have a substantially constant thickness, so that it has substantially constant intrinsic properties and/or to facilitate future bonding to the receiving substrate (as shown in FIG. 1b).

To avoid a relaxation of the stressed layer or an appearance of plastic type internal stresses, the thickness of the layer should remain less than a critical thickness of elastic stress. This critical thickness of elastic stress principally depends on the principal material chosen to form the stressed layer and the difference in lattice parameter from the substrate 1. Those skilled in the art will refer to the state of the art to know the critical thickness of elastic stress value which is used for the stressed layer formed on the material used for the substrate 1.

Once formed, the stressed layer thus has a lattice parameter substantially close to that of its growth substrate 1, and then has internal elastic stresses in compression or in tension.

Once the structure is formed, the third technique of forming a buffer structure includes a first step of formation in the substrate 1 of a perturbation zone at a given depth. A "perturbation zone" is defined as a zone having internal stresses able to form structural perturbations in the surrounding portions. This perturbation zone is advantageously formed on substantially all the surface of the substrate I' and parallel to the surface of the substance 1.

A method of formation of such an embrittlement zone includes an implantation of atomic species in the substrate 1 at the given depth, with a given implantation energy and a given dose of atomic species. In a particular embodiment of the implantation, the atomic species implanted comprise hydrogen and/or helium.

Such a perturbation zone formed by implantation then comprises internal stresses, or even crystallographic defects, brought about by the implanted atomic species in the crystalline network adjacent to the perturbation zone. These internal stresses are then able to create crystallographic perturbations in the overlying zone.

For this purpose, the buffer zone is formed according to this third technique during the performance of a second step by an adapted supply of energy adjusted to suitable parameters for:

- aiding the appearance of perturbations in the region overlying the perturbation zone;
- increasing the extent of these perturbations in this overlying region; and
- causing an at least relative elastic relaxation of the stressed layer following the appearance of perturbations.

The principal purpose of such a supply of energy is thus to cause an at least relative relaxation of the elastic stresses of the stressed layer in order to form a relaxed stressed layer.

The intermediate region of the substrate 1 between the perturbation zone and the stressed layer:

- confines dislocation type defects;
- adapts the lattice parameter of the substrate 1 to the nominal lattice parameter of the stressed layer.

This intermediate region can thus be considered here as a buffer layer.

A heat treatment is advantageously performed in order to generate, if its parameters are suitable, the energy supply sufficient to cause these structural modifications. This thermal treatment is advantageously performed at a temperature or temperatures substantially lower than a critical temperature beyond which a significant number of implanted atomic species will be degassed. Starting from internal stresses in the perturbation zone, local crystallographic perturbations are thus created. Particularly because of minimizing the elastic energy in the region of the stressed layer, these perturbations principally appear in the buffer layer and increase in amplitude under the effect of the thermal treatment.

When these perturbations have become sufficiently great, they act on the stressed layer, relaxing at least relatively the elastic stresses there, these relaxed stresses being principally lattice misfit stresses between the respective nominal lattice parameters of the material of the stressed layer and that of the substrate 1. However, the relaxation of the stressed layer may also be accompanied by the appearance of inelastic type crystalline defects, such as traversing dislocations, in the thickness of the layer.

Suitable treatments, such as a heat treatment, may then be performed to reduce the number of these defects. A suitable treatment can be made use of, for example, which permits increasing the density of dislocations until it is between two limit values, the limit values defining an interval of density of dislocations within which at least a portion of the dislocations is annihilated.

In any case, there is finally obtained a relaxed or pseudo-relaxed layer whose nominal lattice parameter is substantially different from the nominal lattice parameter of the growth substrate 1 and which has a low amount of dislocations prejudicial to the formation of microelectronic components in the relaxed stressed layer. This relaxed or pseudo-relaxed layer can constitute at least a portion of the taking-off structure I.

For more details, reference may be made to B. Höllander et al., specifically in the document entitled "Strain relaxation of pseudomorphic $Si_{1-x}Ge_x/Si(100)$ heterostructures after hydrogen or helium implantation for virtual substrate fabrication" (in Nuclear and Instruments and Methods in Physics Research B 175-177 (2001) 357-367).

The buffer layer thus produced by this third technique of forming the buffer structure and is formed in the substrate 1 as defined before the implementation of this third technique of forming a buffer layer.

A fourth technique of forming a buffer structure is based on a support substrate of the buffer structure to be formed, the surface of which is in relief; and a deposition of elements forming the buffer structure on the support substrate.

Given the non-flatness of the support substrate surface, the deposition of the elements forming the buffer structure is performed in an anisotropic fashion with selective growth effects and local coalescences which confer specific properties on the formed buffer structure.

This fourth mode of forming a buffer structure puts specific techniques and parameters into effect such that the obtained properties of the buffer layer correspond to properties of confinement of crystallographic defects, in order for the taking-off structure I which will be formed on the buffer structure to have a high quality intrinsic structure.

The choice of the topography of the support substrate is one of the essential data for obtaining such a result. In particular, a topography will preferably be chosen with periodically repeated patterns over the whole surface of the support substrate, in order to homogenize its effect on the whole surface of the wafer.

For example, the support substrate may exhibit bands, spaced apart by a given distance. For such a topography in bands, and under certain deposition conditions, it is possible to succeed in concentrating the dislocations of the epitaxial layers in the neighborhood of the bands, and particularly the corners of the bands.

The thickness of the layer in which the major portion of the dislocations is concentrated then constitutes the buffer layer.

For this specific support substrate surface topography in periodically spaced bands over the whole surface of the support substrate, the bands are advantageously formed by an insulating material formed on a substrate and thus forming a mask for the materials which will later be deposited.

Moreover, there may be intercalated between a solid substrate and the relief structure an intermediate layer of crystalline material serving as growth substrate for the buffer layer, the insulating relief structure then being sufficiently fine to not perturb the resumption of growth of the buffer structure on the growth substrate underlying it.

This technique is also termed epitaxial lateral overgrowth, or "ELOG", and is principally applied to nitride film deposition by MOCVD (Metal Organic Chemical Vapor Deposition) epitaxy.

There could be used as a basis, for example, the Bulletin of the "Materials Research Community" of May 1998, Volume 23, No. 5, in the article by Shuji Nakamura entitled "InGaN/GaN/AlGaN-Based Laser Diodes with an Estimated Lifetime of Longer than 10,000 hours" in which growth of GaN on a banded structure of $SiO_2$ is specifically described.

A structure of GaN formed according to this fourth technique of buffer structure formation by ELOG will be described below, in Example 9.

Whatever the structural configuration of the substrate 1 (which does or does not include a buffer structure), the structure is formed by a crystalline material, exhibiting few or no crystallographic defects, in the region of the interface with the taking-off structure I. At least one portion of the different layers forming the taking-off structure I is advantageously formed by growth on the substrate 1, for example by epitaxy by CVD or MBE.

In a first embodiment, growth of at least a portion of these layers is performed in situ, directly in continuation of the formation of the layers which respectively underlie them, these layers also being advantageously formed by layer growth in this case.

In a second embodiment, growth of at least a portion of these layers is performed after light steps of surface finishing of the layers which respectively underlie them, for example by CMP polishing, heat treatment, or other smoothing treatment.

A taking-off structure I is finally obtained, comprising layers of crystalline materials. The taking-off structure I comprises, before recycling, a thickness equivalent to or greater than at least two useful layers. However, the taking-off structure I very advantageously has a thickness greater than two useful layers, in order to free itself from the thicknesses of material removed during treatment(s) performed during recycling to clear up defects created most of the time during taking-off of the useful layer.

Figure 1C:
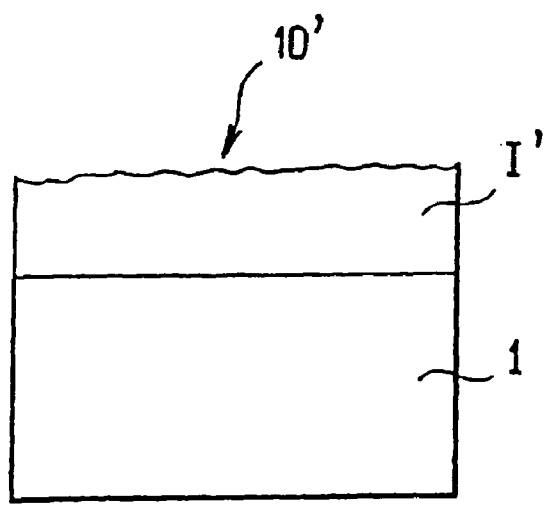

It is indeed usual to find roughness, nonhomogeneities of thickness, structural defects and/or defects of other types, at the surface of a donor wafer 10 after taking-off, like those encountered in the post-taking-off structure I' (see FIG. 1c). For example, projecting and/or rough portions can appear after taking-off in the region of the taking-off surface of the remaining donor wafer 10.

These superficial relief portions which appear on the surface of the taking-off structure I principally depend on the manner of taking-off and on the taking-off technique used.

Thus, for example, a kind of taking-off currently used in industry consists of taking off the useful layer, not over the whole surface of the donor wafer 10, but only from a portion of the latter (which is generally a substantially centered portion), leaving projecting portions on the surface of the donor wafer 10. These projecting portions are generally monolithic and situated peripherally on the surface of the donor wafer 10, the set of projecting portions then being termed in industry "taking-off crown".

Thus, for example, known taking-off techniques, such as for example those which will be studied hereinafter, such as the Smart-Cut® technique already mentioned, sometimes cause surface roughnesses.

The taking-off structure I before taking-off thus should have a thickness of at least two useful layers to be taken off and a thickness equal to or greater than a thickness margin corresponding to the minimum material to be removed during recycling(s). This thickness margin is thus typically of the order of a micron in the case of recycling after a Smart-Cut® type taking-off (discussed hereinafter). However, this thickness margin could be reduced by using efficient recycling techniques such as selective chemical etching.

A principal treatment implemented during recycling according to the invention is a treatment of removal of material adapted to preserve a portion of the taking-off structure I including at least another useful layer which can be taken off after recycling.

This/these removal(s) of material is/are performed on the donor wafer 10, that is, in the region of the free surface of the taking-off structure I which remains after taking-off.

In the context of the invention, any removal of material includes the use of mechanical means for removing material (such as polishing or lapping). This treatment can be performed on the surface and is used for removing a superficial portion of the taking-off structure I from which the useful layer has been taken off, and in particular permits removal of a superficial thickness containing surface defects which have appeared during taking-off, such as crystallographic perturbations of the dislocations or point defects type. This treatment can advantageously be performed in depth in the specific case where the taking-off technique used generated defects present deeper in the thickness of the taking-off structure I.

A technique of removal of material by mechanical polishing means currently used consists of disposing a donor wafer 10 between a polishing head and a polishing plate which can rotate around a drive shaft. The respective principal surfaces of the polishing head and the polishing plate are substantially parallel. A force applied to the polishing head applies the donor wafer 10 against the upper face of the plate. The rotating movement of the donor wafer 10 with respect to the plate then causes rubbing on one face of the donor wafer 10, and thus polishes this face. In a preferred mode, the polishing head, accompanied by the donor wafer 10, is displaced on the upper surface of the polishing plate along a given path in order to best homogenize the polishing. This movement can, for example, be a reciprocating translational movement along a given axis, or a helical movement.

The polishing plate is advantageously covered with a textured or woven material. A polishing solution permitting lubrication of the rubbing actions of the plate on the donor wafer may advantageously be injected. A post-polishing cleaning of the surface of the wafer, generally with deionized water which is injected, can follow the polishing.

A post-polishing rinsing can be performed between polishing and cleaning, generally with a solution including a suitable surfactant, which is injected. The primary function of the surfactant is to maximally disperse in the rinsing solution the residual particles which can continue to erode the surface of the slice, and thus to reduce their deposition on the surface and permit their evacuation.

One or more of these solutions are advantageously injected so as to wet the fabric covering the plate which thus best distributes the solution over the whole surface of the donor wafer 10.

In a first embodiment of the plates, the functions of polishing, rinsing, and cleaning plates are performed by only a single plate. To improve the productivity of the whole method, devices with several plates are preferred. In a second embodiment of the plates, the polishing function is performed by a polishing plate, and the functions of rinsing and cleaning are performed by a single plate termed rinsing/cleaning plate. This embodiment, which decouples polishing from the rinsing/cleaning, improves the quality of rinsing by using for rinsing a plate which is "virgin" of all particulate residues which could remain stuck to a plate.

In a third embodiment of plates, the polishing plate, the rinsing plate, and the cleaning plate are separate plates. This embodiment decouples, with respect to the second embodiment, the rinsing from the cleaning, and thus improves the final cleanliness of the surface of the slice, using for cleaning a plate virgin of all particulate residues which could remain stuck to a rinsing plate.

In addition to polishing, abrasive particles such as particles of silica can be introduced to improve the attack of the material. In addition to polishing, chemical agents can be introduced in order to accompany the mechanical attack effected by the polishing plate with a chemical attack.

In an advantageous embodiment of removal of material from the donor wafer 10, a mechano-chemical planarization, again termed CMP, is used, the principle of which is to bring together the polishing surface of the polishing plate and a polishing fluid which includes abrasive particles and a chemical attack agent.

In addition to mechanical polishing, the polishing fluid then conjointly effects chemical etching by means of the attack agent, and a mechanical etching by means of abrasive particles, of the donor wafer 10 surface to be polished.

The removal of material may again be followed by rinsing and/or cleaning of the polished surface of the donor wafer 10. It is to be noted that the rinsing can in some cases not only act on a more rapid removal of residual and abrasive polishing particles, but also on the chemical polishing action. Indeed, if the chemical attack agent used during polishing has a basic pH, by adding a surfactant, generally acid, to the polishing solution, rapid stopping of the chemical action of the polishing solution is favored.

For certain semiconductor materials such as silicon, the chemical action is preponderant over the mechanical action (the abrasive particles used during the surface polishing of such semiconductor materials being of small size).

Such a rinsing with an acid surfactant, especially for the materials mentioned above, thus permits the polishing action to be significantly stopped and its effect on the slice to be controlled. In this way, the post-polishing thickness is thus ensured and reproducible. Control of the stopping of polishing, and thus more precise control of the thickness removed, can be obtained in this manner.

Furthermore, a progressive injection of the rinsing solution will be preferred. Too rapid an injection would result in a rapid decrease of the pH of the polishing solution and can in certain cases of semiconductor materials such as silicon have the result that the size of the abrasive particles is increased by agglomeration and that there is thus a risk of abrasion damage because of these bulkier particle agglomerations.

An embodiment example of the use of planarization of a layer is presented here in the case where the layer to be planarized at least partially includes silicon. The solution suitable for polishing silicon is generally a basic solution with pH between 7 and 10, preferably between 8 and 10, the chemical agent then preferably being a nitrogenous base such as ammonia. The abrasive particles are preferably silica molecules with particle sizes of the order of a tenth of a micron.

If it is decided to rinse, a surfactant will be used with a pH preferably between 3 and 5, or even around 4, with a CMC (Critical Micellar Concentration) of about 0.1% or less. The time of the rinsing step will advantageously be of the order of 50% of the polishing time.

These mechanical or mechano-chemical means are particularly advantageous in the context of the invention for controlling the quantity of material removed, so as to permit preserving at least a portion of the taking-off structure I. But generally the removal of material from the donor wafer 10 can include the use of any mechanical means for attacking material, such as for example lapping or bombardment with atomic species. This removal of material can, if necessary, be preceded by a heat treatment permitting further smoothing of the surfaces to be removed.

Referring to FIG. 1c, the portion of the original buffer structure which remains after the removal of material is given the reference I'.

It will be preferred initially, and in certain, cases to perform finishing of the surface state of the donor wafer 10 in the region of which the removal of material took place which was effected during the first recycling step, so as to remove any roughness which could have appeared during the removal of material. For this purpose, a heat treatment will be performed, for example.

An example of an overall taking-off method that includes taking off a thin layer and recycling the donor wafer 10 after recycling is given by reference to FIGS. 1a-1d. Referring to FIG. 1a and as previously substantiated, the taking-off structure I has a thickness greater than or equal to two useful layers. A thin layer taking-off method is illustrated in FIGS. 1b and 1c.

A first preferred taking-off step of the invention consists in creating an embrittlement zone in the taking-off structure I, in order to effect a later detaching, and thus to take off the desired layer(s). Several techniques which can be implemented for the creation of such an embrittlement zone are presented here:

A first technique, called Smart-Cut®, known to those skilled in the art (and of which descriptions can be found in a number of works concerning wafer reduction) consists, in its first step, in implanting atomic species (such as hydrogen ions) with a given energy for thus creating an embrittlement zone. A second technique consists of forming a fragile interface by the creation of at least one porous layer, as described for example in European Patent Application No. 0849788.

Referring to FIG. 1b, a second step concerning the taking-off of a thin layer consists in applying a receiving substrate 2 to the surface of the donor wafer 10. The receiving substrate 2 forms a mechanical support which is sufficiently rigid to support the second layer 3, a portion of which will be taken off from the donor wafer 10, and to protect it from possible mechanical stresses coming from the exterior. This receiving substrate 2 may be, for example, silicon, quartz, sapphire, SiC, or another type of material.

The receiving substrate 2 is applied by placing it in intimate contact with the taking-off structure I and in bringing about bonding, in which molecular adhesion is advantageously effected between the substrate 2 and the taking-off structure I. This technique of bonding, as well as alternatives, is in particular described in the document entitled "Semiconductor Wafer Bonding" (Science and Technology, Interscience Technology) by Q. Y. Tong, U. Gösele and Wiley.

The bonding is accompanied, if necessary, by an appropriate preliminary treatment of the respective surfaces to be bonded and/or a supply of thermal energy and/or the provision of a supplementary bonding agent. Thus, for example, a heat treatment performed during or just after bonding enables the bonds to be made rigid. Bonding can also be controlled by a bonding layer, such as silica, intercalated between the taking-off structure I and the receiving substrate 2 and capable of particularly strong molecular bonding.

Advantageously, the material forming the bonding face of the receiving substrate 2 and/or the material of the bonding layer formed if necessary, is electrically insulating for forming an SeOI structure starting from the taken-off layers, the layer of semiconductor of the SeOI structure then being the taken-off portion (i.e., the useful layer) of the taking-off structure I.

Once the receiving substrate 2 is bonded, a removal of the portion of the donor wafer 10 is performed in the region of the previously formed embrittlement zone, by effecting detaching there.

In the case of the said first technique (Smart-Cut®), the implanted zone (forming the embrittlement zone) is subjected in a second step to a thermal and/or mechanical treatment, or other provision of energy, to effect detaching in the region of the embrittlement zone.

In the case of the said second technique, the fragile layer is subjected to a mechanical treatment or other supply of energy to effect detaching in the region of the embrittlement zone.

Detaching in the region of an embrittlement zone according to one of these two techniques permits removal of a major portion of the wafer 10 to obtain a structure comprising the remainder of the taken-off taking-off structure I (which thus represents the useful layer here), the possible bonding layer, and the receiving substrate 2.

Figure 1D:
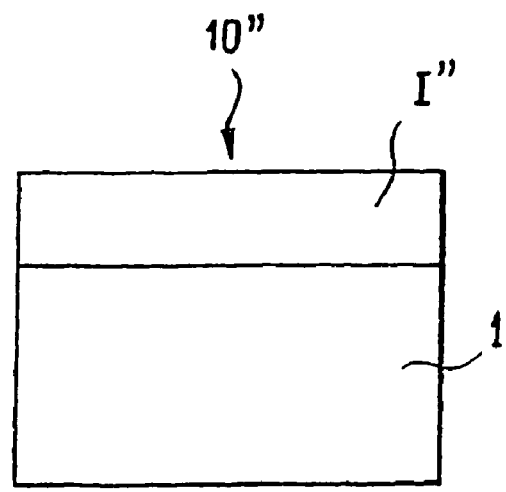

A post-taking-off structure I' forms the portion of the taking-off structure I remaining after taking-off, the whole of the wafer forming a donor wafer 10' to be sent to recycling for later re-use during a taking-off of a later layer. The result of recycling of such a donor wafer 10' is shown in FIG. 1d. It performs a mechanical or mechano-chemical attack of the post-taking-off structure I' according to one of those already discussed above, to remove a portion of the post-taking-off structure I'.

Several techniques for the removal of material by different mechanical means can also be implemented here, particularly if the post-taking-off structure I' includes several layers of different origin, such as, for example, using successive attacks by CMP and by simple polishing. This mechanical attack of material can be preceded and/or followed by surface treatments, such as chemical etching, heat treatment, or smoothing.

Referring to FIG. 1d, the taking-off structure I" obtained after recycling is substantially identical to the taking-off structure I, reduced by a thickness close to the mean thickness of the layer which has been taken off and of the material removed during recycling. According to the invention, this thickness is sufficient to form a useful layer which can be taken off.

The donor wafer 10" is then suitable for providing a taken-off useful layer in the taking-off structure I" during a later taking-off without any other supplementary step such as a step of crystalline growth.

In a specific configuration of the donor wafer 10 before taking-off, the wafer includes a plurality of useful layers which can be taken off. In this specific configuration, and for a taking-off structure I according to the invention in which several useful layers can be taken off between recycling steps according to the invention, in an advantageous context a cyclic method is used, of taking off useful layers from a donor wafer 10 according to the invention, while iteratively performing in succession:

a taking-off process, and a recycling process according to the invention.

Before the implementation of the cyclic taking-off process, a process of forming the donor wafer 10 according to the invention can be performed, with one or more of the techniques of formation of thin layers on substrate 1 described above.

The possibility of taking off several times according to the present invention, starting from a donor wafer 10, in a same structure I formed on substrate 1 without necessarily forming supplementary layers there and/or without necessarily performing a treatment for recovering at least a portion of the substrate 1, permits a gain of time of the implementation of the overall taking-off method, an easier implementation of the method, and a substantially less elevated economic cost than the different methods of the prior art.

After a certain number of takings-off and of recyclings performed in the taking-off structure I, the number of takings-off being in particular a function of the thickness of the latter, the remaining taking-off structure I is no longer sufficiently thick to contain a useful layer to be taken off. The donor wafer 10 is then only formed by about nothing more than the substrate 1.

In a first case, the donor wafer 10 is discarded, and the whole of the substrate 1, which may be complex, long and costly to produce, particularly in the case where the substrate 1 includes a buffer structure, is then lost. In a second, more advantageous, case, at least a portion of the substrate 1 is recovered, by implementing a recycling method.

In the case in which the substrate 1 includes a buffer structure, three types of recycling of the substrate 1 can be implemented:

recycling that includes the removal of the whole of the buffer structure, but permitting preservation of at least a portion of the support substrate on which the buffer structure was formed; this recycling always entails the loss of the portion of the substrate 1 generally the most difficult and the most costly to form; and necessitates the implementation of a supplementary step of reformation of a buffer structure if it is desired, for example, to reform a substrate 1 equivalent to that before recycling;

recycling including the removal of a portion of the buffer structure, and permitting preservation of the support substrate on which the buffer structure was formed, and a portion of the buffer structure, such as a buffer layer which is costly to produce; during recycling, there could be performed, for example and advantageously, a selective removal of material stopped by a stop layer judiciously situated in the buffer structure; a supplementary step of reforming a buffer structure is advantageously implemented if it is desired, in particular, to reform a substrate 1 equivalent to that before recycling;

recycling, including the removal of at least a portion of the remainder of the original taking-off structure I, and permitting the whole of the substrate 1 to be preserved; during recycling a step could be implemented for surface finishing the rest of the taking-off structure I (for example by CMP, heat treatment, sacrificial oxidation, bombardment, or other smoothing technique) and/or performing a selective removal of material, stopped by a stop layer, for example judiciously situated between the taking-off structure I and the substrate 1.

After recycling the substrate 1, a new taking-off structure I is then reformed, in which several useful layers can be taken off according to a method of the invention. This new taking-off structure I may be substantially identical to that before recycling. This new taking-off structure I could have a structure slightly different from that of the taking-off structure I before recycling, by slightly modifying certain parameters of formation. For example, concentrations of certain compounds in a material will be slightly modified.

In any case, the taking-off structure is advantageously formed by layer growth, for example by epitaxy by CVD or MBE. In a first case, the growth of at least one of the layers comprised in the taking-off structure I is formed in situ, directly in continuation of the formation of the underlying support layer, the latter also being advantageously formed by layer growth in this case. In a second case, the growth of at least one of these layers is performed after a light step of surface finishing of the underlying growth support, for example by CMP polishing, heat treatment, or other smoothing technique.

EXAMPLES

In what follows below, examples are presented of configurations of donor wafers 10 comprising structures I with several layers, and capable of being used by a method according to the invention. Specifically, materials are presented which can advantageously be used in such donor wafers 10.

For certain of the examples detailed, the substrate 1 comprises a buffer structure and a support substrate, the buffer structure being formed on the support substrate. The buffer structure then possesses, in the examples concerned, a first lattice parameter in the region of its support substrate and a second lattice parameter in the neighborhood of its interface with the overlying taking-off structure I. Such a buffer structure comprises a buffer layer permitting such an adaptation of the lattice parameter to be performed.

The first method of forming a buffer structure (as discussed above) most often used for obtaining a buffer layer having this property is to have a buffer layer composed of several atomic elements comprising:

at least one atomic element found in the composition of the support substrate, and at least one atomic element not, or scarcely, found in the support substrate, and having a concentration progressing gradually in the thickness of the buffer layer.

The graded concentration of this element in the buffer layer will be the principal cause of the gradual progression of the lattice parameter in the buffer layer in a metamorphic manner. Thus, in this configuration, a buffer layer is principally an alloy. The atomic elements chosen for the composition of the support substrate for the buffer substrate and of the buffer layer may be of Group IV type, such as Si or Ge.

For example, there could be in this case a support substrate of Si and a buffer layer of SiGe, with a Ge concentration progressively evolving with a thickness between a value near 0 at the interface with the support substrate and a specific value on the other face of the buffer layer.

In another case shown, the composition of the support substrate and/or of the buffer layer may comprise a pair of atomic elements of Groups III-V, such as a pair chosen from among the possible combinations (Al, Ga, In)—(N, P, As).

For example, there could be in this case a support substrate of AsGa and a buffer layer comprising As and/or Ga with at least one other element, the latter element evolving progressively with a thickness from a value near 0 at the interface with the support substrate and a specific value on the other face of the buffer layer. The composition of the support substrate and/or of the buffer layer can comprise a pair of atomic elements of Groups 11-VI, such as a pair chosen from among the possible combinations (Zn, Cd)—(S, Se, Te).

Several examples of such configurations follow. The first three examples deal particularly with donor wafers 10 comprising a substrate 1 of Si and a buffer layer of SiGe and other layers of Si and of SiGe. These wafers 10 are particularly useful in the case of taking off layers of SiGe and/or of stressed Si for forming SGOI, SOI, or Si/SGOI structures.

Example 1

The donor wafer 10 comprises:
a substrate 1 that comprises a support substrate of Si and a buffer structure of SiGe formed according to the said first technique of buffer structure formation, comprising a buffer layer and an additional layer;
a taking-off structure I comprising SiGe and possibly one or more fine layers of elastically stressed Si.

The buffer layer preferably has a Ge concentration which progressively increases from the interface with the support substrate, to cause the lattice parameter of the SiGe to progress as explained hereinabove. The thickness is typically between about 1 and 3 micrometers to obtain a good structural relaxation at the surface, and to confine defects related to the difference of lattice parameter so that they are buried.

The additional layer is of SiGe, substantially relaxed by the buffer layer, with an advantageously uniform Ge concentration, substantially identical to that of the buffer layer in the neighborhood of their interface. The concentration of germanium in the silicon within the relaxed SiGe layer is typically between about 15% and 30%. This limitation to 30% represents a typical limitation of the present techniques, but may be made to progress during the coming years.

The additional layer has a thickness which may greatly vary according to the case, with a thickness typically between about 0.5 and 1 micron.

Example 2

The donor wafer 10 comprises:
a substrate 1 comprising a support substrate of Si and a buffer structure formed according to the said first technique of forming a buffer structure comprising a buffer layer of SiGe and an additional Ge layer;
a taking-off structure I comprising before taking-off, AsGa and/or AlGaAs.

The buffer layer preferably has a Ge concentration progressively increasing from the interface with the support substrate, to cause the lattice parameter to progress between that of the Si support substrate and that of the Ge additional layer.

For this purpose, the Ge concentration in the buffer layer is caused to progress from about 0 to about 100%, or more precisely around 98%, for a theoretically complete agreement with the lattice of the two materials.

Example 3

The donor wafer 10 comprises:
a substrate 1 comprising Si and a taking-off structure I comprising, before taking-off, Si and optionally one or more fine layers of elastically stressed SiGe.

Example 4

The donor wafer 10 comprises:
a substrate 1 comprising a support substrate of Si, a taking-off structure I comprising at least one of the following materials: Ge, SiGe, Si, and a buffer layer formed according to the second specific technique of formation of a buffer structure discussed above and disclosed by WO 00/15885, specifically, by:
a deposition of a first layer of Ge or SiGe according to the second specific technique of formation of a buffer structure discussed above and disclosed by WO 00/15885,
optionally followed by a deposition of an optional second layer, capable of improving the crystallographic quality of the overlying layer, as disclosed in WO 00/15885, the second layer being of SiGe (50/50) in the case where the first layer of the buffer layer is of Ge or stressed Si in the case where the first layer of the buffer layer is of SiGe.

The taking-off in the taking-off structure I can concern a set of layers or a single layer of the taking-off structure I. It will be noted that the structures obtained at the end of a taking-off according to this example are free from defects of the dislocation type, even in a buried region. And the structures obtained of this kind can then be used for epitaxially growing supplementary layers, for example of stressed silicon, on the layer of SiGe, Ge, or Si.

Example 5

The donor wafer 10 comprises:
a substrate 1 comprising a support substrate of Si, a buffer layer of Si, formed according to the third technique of formation of a buffer structure, and a taking-off structure I comprising at least one of the following materials: SiGe or Si.

This donor wafer 10 is the wafer obtained after the formation of the buffer layer according to the third technique of forming a buffer structure. In a first embodiment of the buffer layer, the taking-off structure I was present before the formation of the buffer layer. The taking-off structure before taking-off advantageously has a density of defects, such as dislocations, less than about $10^7$ cm$^{-2}$.

The typical thicknesses of a taking-off structure before taking-off, of SiGe with 15% Ge and of a taking-off structure before taking-off, of SiGe with 30% Ge, are respectively about 250 nm and about 100 nm, thus remaining below their respective final critical thicknesses of elastic stress.

According to what has been seen above, a buffer layer is formed according to two principal steps:
- formation of a zone of perturbation in the support substrate 1 of Si by implantation of atomic species such as H or He;
- heat treatment to cause at least a relative relaxation of the elastic stresses in the taking-off structure.

During the first step, the ranges of implantation energies of H or He used are typically between 12 and 25 keV. The doses of H or He implanted are typically between about $10^{14}$ and $10^{17}$ cm$^{-2}$. Thus, for example, for a taking-off structure with 15% Ge, H will preferably be used, with an implant dose around $3 \cdot 10^{16}$ cm$^{-2}$ at an energy around 25 keV. Thus, for example, for a taking-off structure with 30% Ge, H will preferably be used, with an implant dose around $2 \cdot 10^{16}$ cm$^{-2}$ at an energy around 18 keV. The implant depths of the atomic species in the substrate 1 are then typically between about 50 nm and 100 nm.

The heat treatment performed during the second step should be suitable for markedly increasing the number and amplitude of perturbations in the region situated between the perturbation zone and the taking-off structure. This region in which the perturbations are displaced will then form the said buffer layer. The appearance of dislocations in the buffer layer then causes an overall relaxation of the taking-off structure.

The heat treatment is preferably performed under an inert atmosphere. However, the heat treatment can be performed under another atmosphere, such as for example an oxidizing atmosphere. Thus, a specific heat treatment to be performed for this type of donor wafer 10 is carried out at temperatures typically between about 400° C. and 1,000° C. for a time which can be between about 30 s and 60 minutes, and more specifically about 5 minutes to about 15 minutes.

In a second embodiment of the buffer layer, the buffer structure I is not present before the formation of the buffer layer, the donor wafer then advantageously appearing in the following form a substrate 1 of Si and a layer of SiGe with at least 15% of Ge, the SiGe being elastically stressed. The techniques and parameters of relaxation of this SiGe layer are substantially identical to those of the first embodiment of the buffer layer.

After formation of the buffer layer, layers forming the taking-off structure I including the overall relaxed layer or set of layers are formed. The taking-off structure I is thus formed after the buffer layer, contrary to the first embodiment proposed in this example.

For more details on such experimental techniques, reference will be made to the studies carried out by B. Höllander et al., particularly in the document entitled "Strain relaxation of pseudomorphic Si$_{1-x}$Ge$_x$/Si(100) heterostructures after hydrogen or helium ion implantation for virtual substrate fabrication" (in Nuclear and Instruments and Methods in Physics Research B 175-177 (2001) 357-367).

After bonding of the wafer 10 to a receiving substrate 5, taking-off is performed with or without intermediate bonding layer, according to one or more known techniques, previously described, and the wafer is then recycled according to the invention.

Example 6

The donor wafer 10 comprises:
- a substrate 1 comprising a support substrate comprising at least one portion of AsGa in the region of its interface with the overlying buffer structure and a buffer structure of III-V material formed according to the first technique of formation of a buffer structure; and
- a taking-off structure I comprising a III-V material before taking-off.

The main purpose of this buffer structure is to adapt the lattice parameter to the material of the taking-off structure I in the neighborhood of their interface (which is for example a nominal value of about 5.87 angstroms in the case of InP) to that of AsGa (the nominal value of which is about 5.65 angstroms).

In the solid III-V materials, the practical interest of such a buffer structure may appear, for example, in the light of a comparison between different materials such as solid InP and solid AsGa, solid AsGa being, for example, less costly, more available on the semiconductor market, less mechanically fragile, with already known implementation of rear face contact technologies, and with larger sizes (typically 6 inches instead of 4 inches for solid InP) than solid InP. However, the electronic performance of InP is as a general rule better than that of AsGa.

Thus, the said donor wafer 10 gives, for example, a solution to the formation of a layer of InP dimensioned to 6 inches by proposing a taking-off structure I comprising in P formed on an AsGa support substrate and relaxed by means of a buffer structure.

Thus there is seen here all the advantage which such a donor wafer 10 can offer: it permits an active layer of a III-V material to be formed, for transfer with a given quality and properties, capable for example of being close to the properties which would have been found in an embodiment of the said solid material.

The buffer structure included in such a donor wafer 10 necessitates a thickness typically greater than one micron, and which can be brought to progress toward greater thicknesses, particularly if destroying it after each taking-off can be avoided, specifically by means of a recycling method according to the present invention.

In the example of a taking-off structure I comprising essentially relaxed InP in the region of its interface with the underlying buffer structure, the buffer structure of the substrate 1 then advantageously includes a buffer layer formed of InGaAs with an In concentration progressing between 0 and about 53%.

The buffer structure may further comprise an additional layer of III-V material, such as InGaAs or InAlAs, with a substantially constant concentration of the atomic elements.

In a particular case of taking-off, at least one InP layer will be taken off the taking-off structure I for transfer to a receiving substrate 2. The advantage of possible electrical or electronic properties can thus be attained. It is for example the case if the portion taken off furthermore comprises InGaAs or InAlAs: discontinuities of electronic bands between the latter material and InP notably create better electron mobilities in the taken-off layers.

Other configurations of donor wafers 10 are possible, comprising other III-V compounds. The applications of such taking-off of layers are typically embodiments of HEMT or HBT (High Electron Mobility Transistor and Heterojunction Bipolar Transistor).

Example 7

The donor wafer 10 comprises:
- a substrate 1 comprising a support substrate comprising AsGa in the region of its interface with the overlying buffer structure and a buffer structure formed according to the first technique of buffer formation, and comprising InGaAs in the region of its interface with the taking-off structure I; and a taking-off structure I comprising, before taking-off, InP and/or $In_xGa_{1-x}As_yP_{1-y}$.

This type of donor wafer 10 has already been described in Example 6.

Example 8

The donor wafer 10 comprising:

a substrate 1 comprising a support substrate of sapphire or of SiC or of Si and a buffer structure formed according to the first technique of formation of a buffer layer, the buffer structure comprising:

a metamorphic buffer layer of $Al_xGa_{1-x}N$, x varying with thickness from about 0 to 1 starting from the interface with the sapphire;

an additional layer of GaN intended to confine dislocation-type crystallographic defects;

a taking-off structure I comprising layers of nitrides.

The III-V nitrides GaN, AlN and InN are of interest in the field of microelectronics, specifically in the light emitting devices such as lasers for applications such as the reading and writing of data stored at high densities on compact discs or such as electroluminescent diodes for new display technologies. These materials are also all designated for the manufacture of electronic components of high power or operating at high temperature.

A mode of formation of layers of nitrides included in the taking-off structure I is epitaxial growth on the additional GaN layer by deposition of organometallic compounds of Group I, such as trimethyl gallium, trimethylamine alane, or trimethyl indium for respective deposition of layers of GaN, AlN and InN.

The present invention, when used for transferring several of these nitride layers from the same donor wafer 10 involves a recycling step between each layer taking-off, permitting the preparation of another layer of the taking-off structure I for another taking-off.

Example 9

The donor wafer 10 comprising:

a substrate 1 comprising a support substrate of sapphire or SiC or Si, an intermediate layer of GaN, a mask of $SiO_2$, and a buffer layer of GaN; and a taking-off structure I comprising a layer, or set of layers, of nitride of which at least one layer is of GaN.

The mode of formation of the buffer layer is that described above, in the description of the fourth technique of forming a buffer layer, and consists of bringing about anisotropic growth of successive layers of nitrides, specifically GaN here, according to the ELOG technique.

The $SiO_2$ mask used in this configuration advantageously has the form of bands disposed on the intermediate layer of GaN in a periodic manner and substantially mutually parallel. The thickness of each band is typically of the order of several tenths of a micron, while the width of a band is of the order of several microns. The period spacing the bands apart is typically about 10 microns or 15 microns. For example, there could be a band system of period 13 microns, each band having 0.2 microns thickness and 5 microns width.

As explained above in a general case, these $SiO_2$ bands will cause dislocations, localized in the neighborhood of the free surface of these bands, in the layer(s) of GaN deposited above them. The thickness of GaN in which these dislocations are localized around the mask then constitutes the buffer layer. The layers of GaN or other materials having lattice parameters close to GaN are deposited on the buffer layer to form the taking-off structure I. This taking-off structure I then comprises at least two layers, each having a thickness equal to or greater than the thickness of a useful layer which it is desired to take off.

For more details of the mode of forming a wafer according to the LOG method, reference can be made to the document taken from the "MRS Bulletin" of May 1998, Volume 23, No. 5, at the article of Shuji Nakamura entitled "In/GaN/AlGaN-Based Laser Diodes with an Estimated Lifetime of Longer than 10,000 Hours".

Layers of InN can in particular be integrated into this taking-off structure I during the course of its formation, as previously described in Example 8. Other constituents can be added to the semiconductor layers mentioned in this document, such as carbon with a carbon concentration in the considered layer substantially equal to or less than 50%, or more particularly with a concentration equal to or less than 5%.

Finally, the present invention is not limited to a donor wafer 10 of materials mentioned in the examples above, but also extends to other types of materials belonging to Groups II, III, IV, V or VI and to alloys belonging to Groups IV-IV, III-V, or II-VI. It should be mentioned that in the case of alloy materials, the alloys chosen can be binary, ternary, quaternary, or of higher degree.

In the case in which the donor wafer 10 includes a buffer layer or a buffer structure, the present invention is not limited to a buffer layer or buffer structure having as primary function an adaptation of the lattice parameter between two adjacent structures having respective different lattice parameters, but also concerns any buffer layer or buffer structure such as defined in the most general manner in this document.

The structures finally obtained starting from the taking-off of a useful layer are also not limited to SGOI, SOI, or Si/SGOI structures, to HEMT and HBT structures for transistors, or to structures for applications in lasers.

What is claimed is:

1. A method of transferring useful layers from a donor wafer which comprises:

forming a layer on a surface of the donor wafer at a thickness sufficient to provide multiple useful layers for subsequent detachment;

detaching a portion of the formed layer for transfer as a first useful layer while leaving behind a remaining portion of the layer; and removing material from the remaining portion of the formed layer to provide a planarized surface for subsequent detachment of an additional useful layer.

2. The method of claim 1, which further comprises applying a finishing treatment to the planarized surface of the formed layer on the donor wafer.

3. The method of claim 2, wherein the finishing treatment comprises a heat treatment.

4. The method of claim 1, wherein the forming comprises forming a multi-layer structure wherein the useful layers are formed of materials having sufficiently different properties such that one layer may be selectively removed while at least one other layer remains intact; and the detaching is conducted such that the remaining portion includes at least one additional useful layer for subsequent transfer without reforming the multilayer structure; and which further comprises detaching a second useful layer from the remaining portion of the formed layer.

5. A method of transferring useful layers from a donor wafer which comprises:
forming a layer on a surface of the donor wafer at a thickness sufficient to provide multiple useful layers for subsequent detachment;
detaching a portion of the formed layer for transfer as a first useful layer while leaving behind a remaining portion of the layer; and
removing material from the remaining portion of the formed layer to provide a planarized surface for subsequent detachment of an additional useful layer, wherein the material is removed mechanically by one or more of polishing, abrasive polishing, or mechano-chemical planarization.

6. A method of transferring useful layers from a donor wafer which comprises:
forming a layer on a surface of the donor wafer at a thickness sufficient to provide multiple useful layers for subsequent detachment;
forming a buffer structure on the donor wafer, wherein the buffer structure includes a support substrate and a buffer layer between the support substrate and the formed layer;
detaching a portion of the formed layer for transfer as a first useful layer while leaving behind a remaining portion of the layer; and
removing material from the remaining portion of the formed layer to provide a planarized surface for subsequent detachment of an additional useful layer.

7. The method of claim 6, wherein the buffer layer comprises a semiconductor material of constant chemical composition having a lattice misfit with the support substrate, with the buffer layer having crystallographic defects in order to relax elastic stresses in the formed layer.

8. The method of claim 6, wherein the buffer layer has a lattice parameter progressing substantially in thickness between a lattice parameter of the support substrate and another lattice parameter substantially different from the lattice parameter of the support substrate.

9. The method of claim 6, wherein the buffer structure further comprises an additional layer having one or more of: a sufficient thickness to confine defects, or a surface lattice parameter that is substantially different from that of the support substrate.

10. The method of claim 6, wherein the donor wafer comprises one of the following:
(A) a support substrate of Si and a buffer structure comprising a buffer layer of SiGe having a Ge concentration which increases in thickness and an additional layer of SiGe that is relaxed by the buffer layer;
(B) a support substrate of Si and a buffer structure comprising a buffer layer of SiGe having with a Ge concentration which increases in thickness between about 0% and about 100% and an additional layer of Ge that is relaxed by the buffer layer;
(C) a relatively thick layer of Si;
(D) a support substrate comprising AsGa in contact with the buffer structure;
(E) a buffer structure comprising a buffer layer having an atomic alloy of ternary or higher degree, belonging to Group III-V, and having a composition which chosen from among the possible combinations of (Al, Ga, In), (N, P, As), and at least two elements chosen from Group III or V, these two latter elements having a concentration evolving gradually in the thickness of the buffer layer;
(F) the buffer structure of (E) which further comprises, near its interface with the support substrate, a lattice parameter that is close to that of InP;
(G) a support substrate of sapphire, SiC or Si, with a buffer structure comprising a buffer layer of $Al_xGa_{1-x}N$, with x varying from 0 to 1 starting from the interface with the support substrate, optionally including an additional layer of GaN; or
(H) a support substrate of sapphire, SiC, or Si, a mask and a buffer layer of GaN, optionally with another layer of GaN between the mask and support substrate.

11. The method of claim 10, wherein the useful layer to be detached comprises Si or elastically stressed Si; Ge or elastically stressed Ge, SiGe and Ge; GaAs and Ge; an alloy belonging to Group III-V; GaAs, InP; InGaAs; AlN, InN, or GaN.

12. The method of claim 6, wherein the buffer layer is formed by epitaxy of a superficial layer on the support substrate by:
stabilizing the support substrate to a predetermined first temperature,
chemical vapor phase depositing of a base layer at the said predetermined first temperature to a predetermined thickness that is less than a desired final thickness;
increasing the predetermined first temperature to a second predetermined temperature; and
chemical vapor phase depositing additional material at the predetermined second temperature until the desired final thickness of the superficial layer is obtained;
wherein the buffer layer is that portion of the superficial layer that interfaces with the support substrate and extends over a thickness for which the rate of crystallographic defects is greater than a limit value, with the remaining portion of the superficial layer representing being at least a portion of the useful layer.

13. The method of claim 12, wherein the useful layer is completely formed by epitaxy on the superficial layer.

14. The method of claim 12, wherein the first predetermined temperature is about 400° C. to 500° C., and the second predetermined temperature is about 750° C. to 850° C.

15. The method of claim 12, wherein the buffer layer is formed so as to have its lattice parameter progressing substantially in thickness between the lattice parameter of the support substrate and another lattice parameter substantially different from the lattice parameter of the support substrate.

16. The method of claim 15, which further comprises forming a bonding layer on the formed layer prior to bonding the surface to the receiving substrate.

17. The method of claim 16, which further comprises forming an embrittlement zone in the formed layer on the donor wafer prior to bonding, and wherein the useful layer is detached from the donor wafer by supplying energy to the embrittlement zone.

18. The method of claim 17, wherein the embrittlement zone is formed by implantation of atomic species or by creating a porous layer.

19. The method of claim 17, wherein the embrittlement zone is formed by implantation of atomic species comprising hydrogen.

20. The method of claim 17, which further comprises finishing the unbonded surface of the useful layer that is detached from the donor wafer after transfer to the receiving substrate.

21. The method of claim 6, wherein the buffer layer is formed by:
  forming an elastically stressed layer on the donor wafer;
  forming a perturbation zone, capable of forming structural perturbations, at a given depth; and
  supplying energy to bring about an at least relative relaxation of at least part of the elastically stressed layer, with the relative relaxation taking place across a region delimited by the perturbation zone and by the stressed layer, this region also confining crystallographic defects and representing a buffer layer.

22. The method of claim 21, wherein the supplied energy is thermal energy and which further comprises epitaxially forming the useful layer on layer that was subjected to the thermal energy.

23. The method of claim 21, wherein the perturbation zone is formed by implantation of atomic species.

24. The method of claim 23, wherein the implanted atomic species at least in part comprise hydrogen and/or helium.

25. The method of claim 6, wherein the buffer layer is formed by ELOG on a support substrate comprising at the surface a mask in relief according to specific patterns, the buffer layer being the thickness of the layer deposited by lateral epitaxy in which defects are confined relative to the layers deposited by lateral epitaxy thereon and representing the useful layer.

26. The method of claim 25, wherein the specific patterns of the mask are periodically spaced electrically insulating bands that are substantially mutually parallel and sufficiently fine to not perturb the ELOG.

27. The method of claim 25, wherein the support substrate comprises a solid substrate; an intermediate layer having a lattice parameter close to the nominal lattice parameter of the material deposited by ELOG; or the mask.

* * * * *